(12) United States Patent
Toner et al.

(10) Patent No.: US 9,293,569 B2
(45) Date of Patent: Mar. 22, 2016

(54) BIPOLAR TRANSISTOR

(71) Applicant: X-FAB Semiconductor Foundries AG, Erfurt (DE)

(72) Inventors: Brendan Toner, Kuching (MY); Xuezhou Cao, Plymouth (GB); Fred Fang, Kuching (MY); Chuan Chien Tan, Kuching (MY)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 0 days.

(21) Appl. No.: 13/998,242

(22) Filed: Oct. 15, 2013

(65) Prior Publication Data

US 2014/0042592 A1 Feb. 13, 2014

Related U.S. Application Data

(63) Continuation-in-part of application No. PCT/EP2011/055731, filed on Apr. 12, 2011.

(51) Int. Cl.
| | |
|---|---|
| *H01L 29/73* | (2006.01) |
| *H01L 29/40* | (2006.01) |
| *H01L 29/66* | (2006.01) |
| *H01L 29/732* | (2006.01) |

(52) U.S. Cl.
CPC .............. *H01L 29/73* (2013.01); *H01L 29/402* (2013.01); *H01L 29/66272* (2013.01); *H01L 29/66295* (2013.01); *H01L 29/7322* (2013.01)

(58) Field of Classification Search
CPC .............................. H01L 29/73; H01L 29/732
USPC .................................................. 257/565, 585
See application file for complete search history.

(56) References Cited

U.S. PATENT DOCUMENTS

| | | | |
|---|---|---|---|
| 3,204,160 A | 8/1965 | Sah | |
| 4,669,177 A * | 6/1987 | D'Arrigo et al. | 438/204 |
| 5,027,177 A * | 6/1991 | Vasudev | 257/290 |
| 5,028,977 A * | 7/1991 | K. O. Kenneth et al. | 257/370 |
| 5,336,625 A | 8/1994 | Tong | |

(Continued)

FOREIGN PATENT DOCUMENTS

| | | |
|---|---|---|
| WO | 2006070304 A2 | 7/2006 |
| WO | 2010110725 A1 | 9/2010 |

OTHER PUBLICATIONS

Kosier, S. L., R. D. Shrimpf, R. N. Nowlin, D. M. Fleetwood, M. DeLaus, R. L. Pease, W. E. Combs, A. Wei, and F. Chai. "Charge separation for bipolar transistors." Nuclear Science, IEEE Transactions on 40, No. 6 (1993): 1276-1285.*

(Continued)

*Primary Examiner* — Earl Taylor
(74) *Attorney, Agent, or Firm* — Nixon & Vanderhye PC

(57) ABSTRACT

A bipolar junction transistor is provided with an emitter region, an oxide region, a base region and a collector region. The base region is located between the emitter region and the oxide region and has a junction with the emitter region and an interface with the oxide region. An at least partially conductive element such as metal or silicon is positioned to overlap with at least part of the junction between the base region and the emitter region, thereby forming a gate. The gate also overlaps with at least part of the interface between the base region and the oxide region. When a suitable bias voltage is applied to the gate, the gain of the transistor can be increased.

22 Claims, 10 Drawing Sheets

(56) References Cited

U.S. PATENT DOCUMENTS

| | | | |
|---|---|---|---|
| 5,559,348 A * | 9/1996 | Watabe et al. | 257/141 |
| 6,495,904 B1 * | 12/2002 | Kitch | 257/565 |
| 6,828,650 B2 | 12/2004 | de Fresart et al. | |
| 8,293,621 B2 * | 10/2012 | Takafuji et al. | 438/473 |
| 2002/0130330 A1 * | 9/2002 | Kim et al. | 257/107 |
| 2003/0222329 A1 | 12/2003 | Fresart et al. | |
| 2004/0256678 A1 | 12/2004 | Goshima et al. | |
| 2005/0245046 A1 * | 11/2005 | Takafuji et al. | 438/450 |
| 2008/0135971 A1 * | 6/2008 | Nishimura et al. | 257/492 |
| 2009/0321822 A1 * | 12/2009 | Knaipp et al. | 257/335 |
| 2012/0086080 A1 * | 4/2012 | Chen et al. | 257/355 |
| 2013/0240910 A1 * | 9/2013 | Nonaka | 257/77 |

OTHER PUBLICATIONS

International Search Report for corresponding application PCT/EP2011/055731 filed Apr. 12, 2011; Mail date Mar. 5, 2012.

* cited by examiner

Collector well · Main current flow of emitter electrons

Secondary current flow from emitter to collector created at LOCOS edge (shortest base width to the collector)

BIPOLAR TRANSISTOR

CROSS REFERENCE TO RELATED APPLICATION

This application is a continuation-in-part of International Patent Application Number PCT/EP2011/055731 filed on 12 Apr. 2011, the entire contents of which are herein incorporated by reference.

TECHNICAL FIELD

The present invention relates to semiconductor devices. More specifically, the present invention relates to a bipolar transistor. Embodiments of the invention exhibit an improved linearity of the gain, or substantially linear gain, with respect to bias current by reduction of the base-emitter recombination current. Some embodiments exhibit an increased gain of the transistor.

BACKGROUND

Bipolar junction transistors are constructed from doped semiconductor material and are often used in switching and amplifying applications.

A problem with bipolar junction transistors is that the high base recombination current is a main contributor to degradation of low current gain. Under typical operation of e.g. an NPN transistor, electrons injected from the emitter pass through the base. These minority carriers are subject to recombination giving rise to an additional hole current from the base. This parasitic current mechanism degrades the common emitter gain of the bipolar transistor. This effect is particularly pronounced in the low current region where the mechanism is a sizable contribution to the overall base current.

In order to address the above problem, U.S. Pat. No. 5,336,625 describes forming a protective structure from a gate material which protects a base active region of bipolar transistors from particle contamination at the low temperature oxide deposition step. This prevents plasma damage at the ashing and resist strip steps following the NMOS transistor source/drain implantation step. The protective structure is subsequently removed to expose the active area of the bipolar transistor prior to the formation the bipolar transistor's base region.

U.S. Pat. No. 6,828,650 describes utilizing a trench positioned between the emitter and base of a transistor to reduce the current gain variation by limiting recombination. The pullback trench structure takes advantage of the lateral component of the emitter current allowing it to contribute to the current gain of the device.

BRIEF SUMMARY

Some embodiments of the present invention aim to address the problem of recombination current and consequently improve gain linearity in a bipolar junction transistor in an alternative technique to those discussed above. Some embodiments of the present invention aim to provide a technique for increasing the gain of the transistor.

According to a first aspect of the present invention there is provided a bipolar junction transistor comprising an emitter region, an oxide region, a base region located between the emitter region and the oxide region and having a junction with the emitter region and an interface with the oxide region, and a collector region. An at least partly conductive element is positioned to overlap with at least part of the junction between the base region and the emitter region. This element also overlaps with at least part of the interface between the base region and the oxide region. In most embodiments this element covers much or all of the base between the emitter region and the oxide region and can thus be regarded as a gate.

The at least partially conductive element can be used to control the base recombination current by manipulating a bias voltage applied to the partially conductive element. Depending on the desired effect, the polarity of the bias voltage may or may not correspond to the doping polarity of the base. For the purpose of this specification, a "bias voltage of corresponding polarity" is defined as positive for an NPN transistor, and negative for a PNP transistor. Conversely, a "bias voltage of opposite polarity" is defined as positive for an PNP transistor, and negative for a NPN transistor.

Applying a bias voltage of opposite polarity to the partially conductive element—in the case of an NPN transistor this bias voltage would be negative—causes the base region's surface underneath the partially conductive element to be in accumulation mode. This has the effect of inhibiting electrons at the sidewalls of the junction between the emitter and the base regions and therefore acts to suppress the base recombination current.

The silicon surface between the base region and the emitter region is a known hotspot for generation-recombination centers. By suppressing charge carriers in this region, the base recombination current here can be minimized. With minimization of the recombination current, the base current will be lower and consequently a higher common emitter gain (defined as the collector current divided by the base current) can be achieved at low base-emitter voltages.

Applying a bias voltage of corresponding polarity to the partially conductive element (positive for an NPN transistor) can be used to increase the gain over a certain range of collector currents.

According to a second aspect of the present invention there is provided a method comprising:
  providing a bipolar junction transistor comprising:
    an emitter region;
    an oxide region;
    a base region located between the emitter region and the oxide region and having a junction with the emitter region and an interface with the oxide region;
    a collector region; and
    an at least partially conductive element positioned to overlap with at least part of the junction between the base region and the emitter region,
    wherein said element also overlaps with at least part of the interface between the base region and the oxide region;
  the method further comprising:
  applying a bias voltage to the at least partially conductive element, the polarity of the bias voltage corresponding to the doping polarity of the base region; and
  increasing the gain of the transistor by increasing the magnitude of the bias.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the following, embodiments of the present invention will be described by way of example only and with reference to the accompanying drawings, in which.

DETAILED DESCRIPTION

Figure 1:
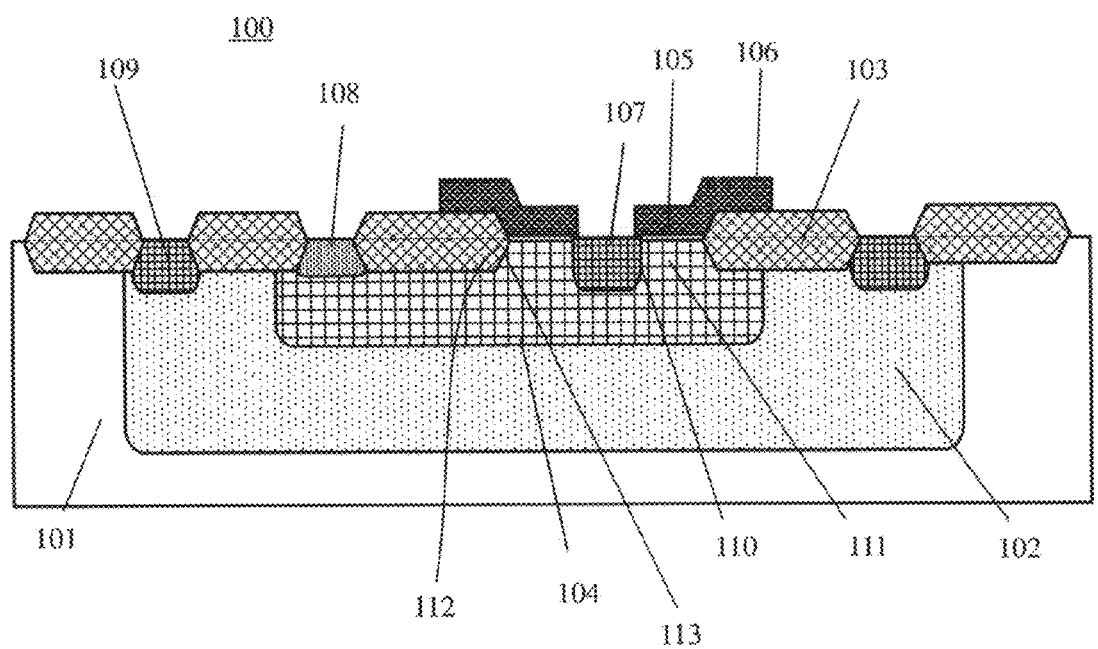
FIG. 1 shows a cross-sectional view of a bipolar junction transistor.

FIG. 1 shows a cross-sectional view of a bipolar junction transistor 100 according to an embodiment of the present invention. The bipolar junction transistor 100 shown in FIG. 1 is an NPN transistor formed in a p-type substrate 101. The transistor 100 comprises a deep N well region 102 formed within the p-type substrate 101. A P well region 104 is formed within the deep N well region 102, and an N+ region 107 is formed within the P well 104. These wells form the collector 102, base 104, and emitter 107 respectively of the bipolar junction transistor. A base contact 108 is formed in the base region and a collector contact 109 is formed in the collector region. On the surface of the substrate in between the contacts, LOCOS/STI field oxide separators 103 are formed. These separate the base contact 108 and the collector contact 109 on the surface of the transistor 100. The field oxide also runs from the base contact 108 towards the emitter 107 leaving a portion of the surface of the base region 104 which is not covered by the field oxide. At the interface 113 between the emitter facing side of field oxide 103 and base region 104 the field oxide 103 has a tapered construction, also called a "bird's beak" 112.

In addition to the traditional construction of a transistor as described above, a doped poly-crystalline silicon (poly silicon) gate 106 is overlaid across the base emitter junction 110 and extends onto the field oxide 103, over the bird's beak 112 and beyond. The poly silicon gate 106 receives an N+ implant for the case of an NPN bipolar transistor. Between the poly silicon gate 106 and the silicon substrate 101, a gate oxide layer 105 is formed.

When a negative bias voltage is applied to the poly silicon gate 106, the silicon surface of the P well base region 111 underneath the poly silicon gate is in accumulation mode. This prevents recombination currents at the side wall 110 of the emitter and at the silicon surface beneath the poly silicon gate 106.

Figure 2:
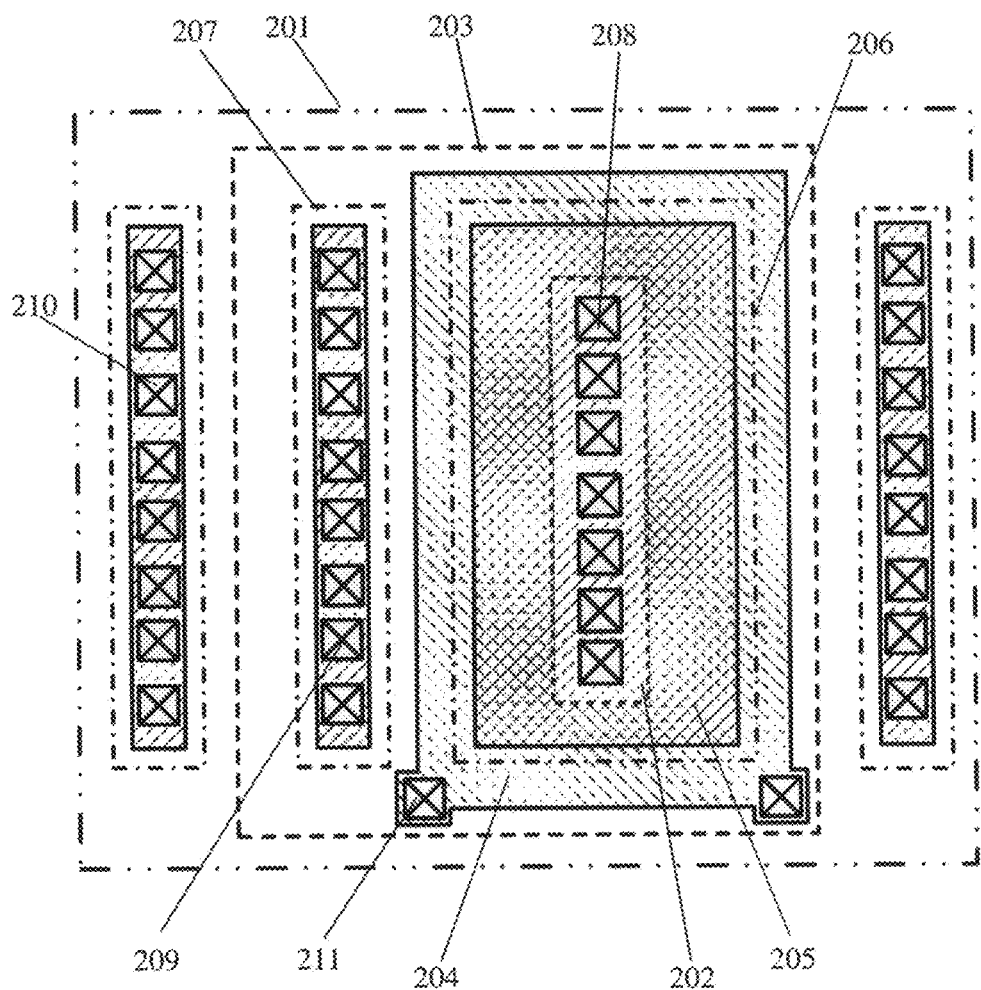
FIG. 2 shows a top view of a bipolar junction transistor.

FIG. 2 shows a top view of the layout of a bipolar junction transistor according to an embodiment of the present invention. The deep N well 201 is formed in a silicon substrate. A P well 203 is formed within the deep N well. Within the P well a region 206 is doped with negative impurities to form the emitter. Emitter contacts 208 are located in the center of this region. A poly silicon gate 204 is formed around the emitter contacts 208. The poly silicon gate 204 is spaced from the emitter contacts 208. The poly silicon gate 204 forms a ring around the emitter contacts 208. The poly silicon gate 204 overlaps with the active area 202 of the emitter region. Poly silicon contacts 211 are connected to the poly silicon gate 204. Adjacent to the poly silicon gate 204 there is a line of base contacts 209 and located adjacent to the base contacts 209 are the collector contacts 210. A further set of collector contacts are located on a side of the poly silicon gate 204 surrounding the emitter contacts which is opposite to the base contacts 209.

In the production process, the poly silicon 204 is created before the emitter region is implanted. The poly silicon will act to mask this implant, so the emitter will be inside the poly silicon ring. However, in FIG. 2, it can be seen that the poly silicon ring 204 overlaps the N+ doped emitter region 206. This is because during processing, the implanted N+ doping will expand laterally under the poly silicon ring 204 so that the poly silicon ring overlaps the base-emitter junction. The outer edge of the poly silicon ring 204 overlaps with the LOCOS field oxide as shown in FIG. 1.

Figure 4:
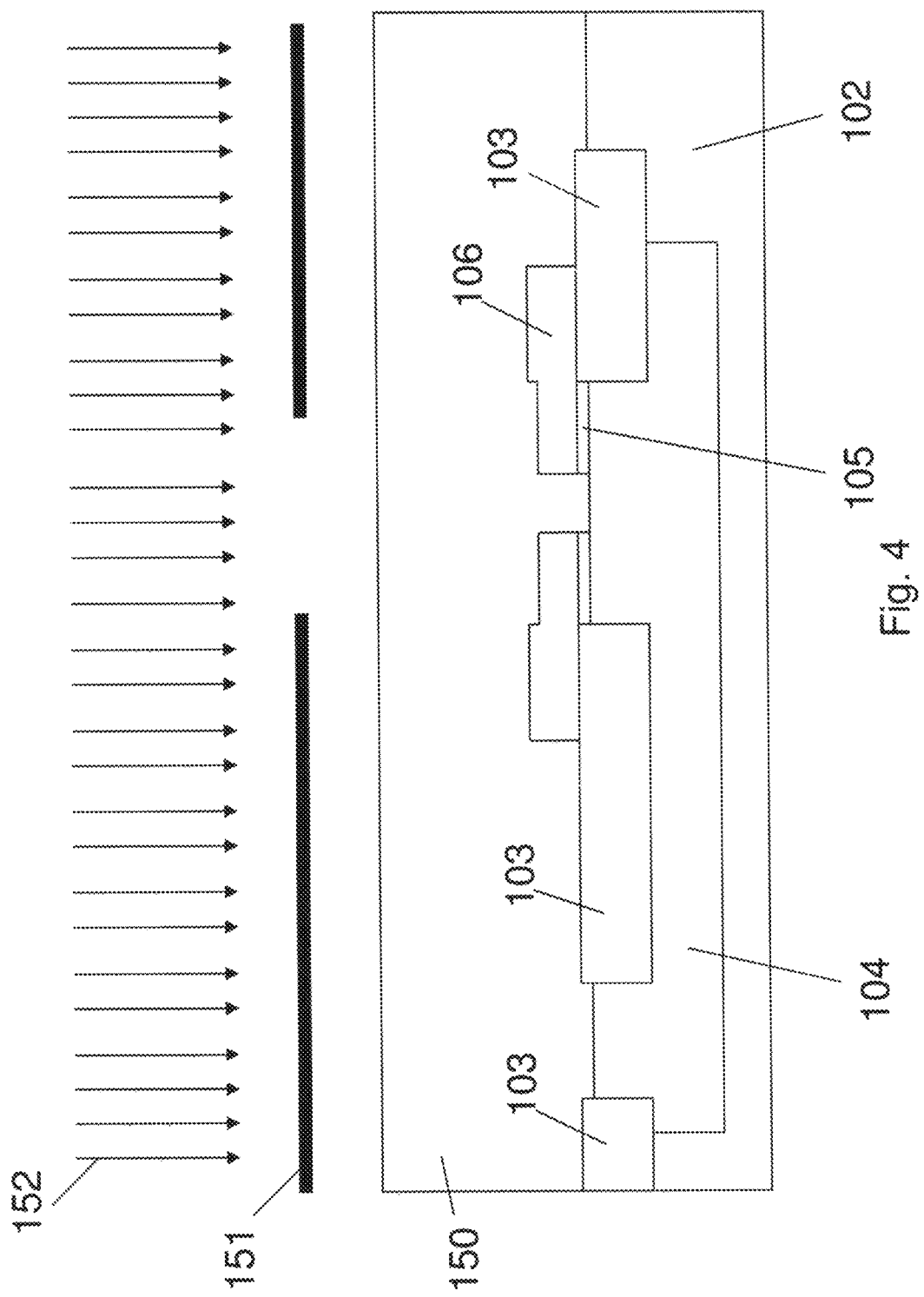
FIG. 4 shows a first stage during processing of a transistor according to an embodiment.

The processing steps of an embodiment will now be described in more detail, with reference to FIGS. 4 to 7. FIG. 4 shows a portion of a bipolar junction transistor such as the transistor shown in FIG. 1, during a first processing stage. Processing steps which would have taken place before the stage shown in FIG. 4 are not shown or explained in detail. Guided by the present disclosure, one skilled in the art will be able to perform these steps so as to arrive at the device shown in FIG. 4. The device shows various portions also shown in FIG. 1, such as N well region/collector 102, field oxide separators 103, P well/base 104, gate oxide layer 105 and gate 106.

A photo resist layer 150 is then formed over the device. A mask (such as an N+ mask) 151 is positioned over the photo resist layer 150 such that it shields most of the device but not the central region of gate 106. The photo resist 150 is then exposed to light through mask 151, as is known in the art.

Figure 5:
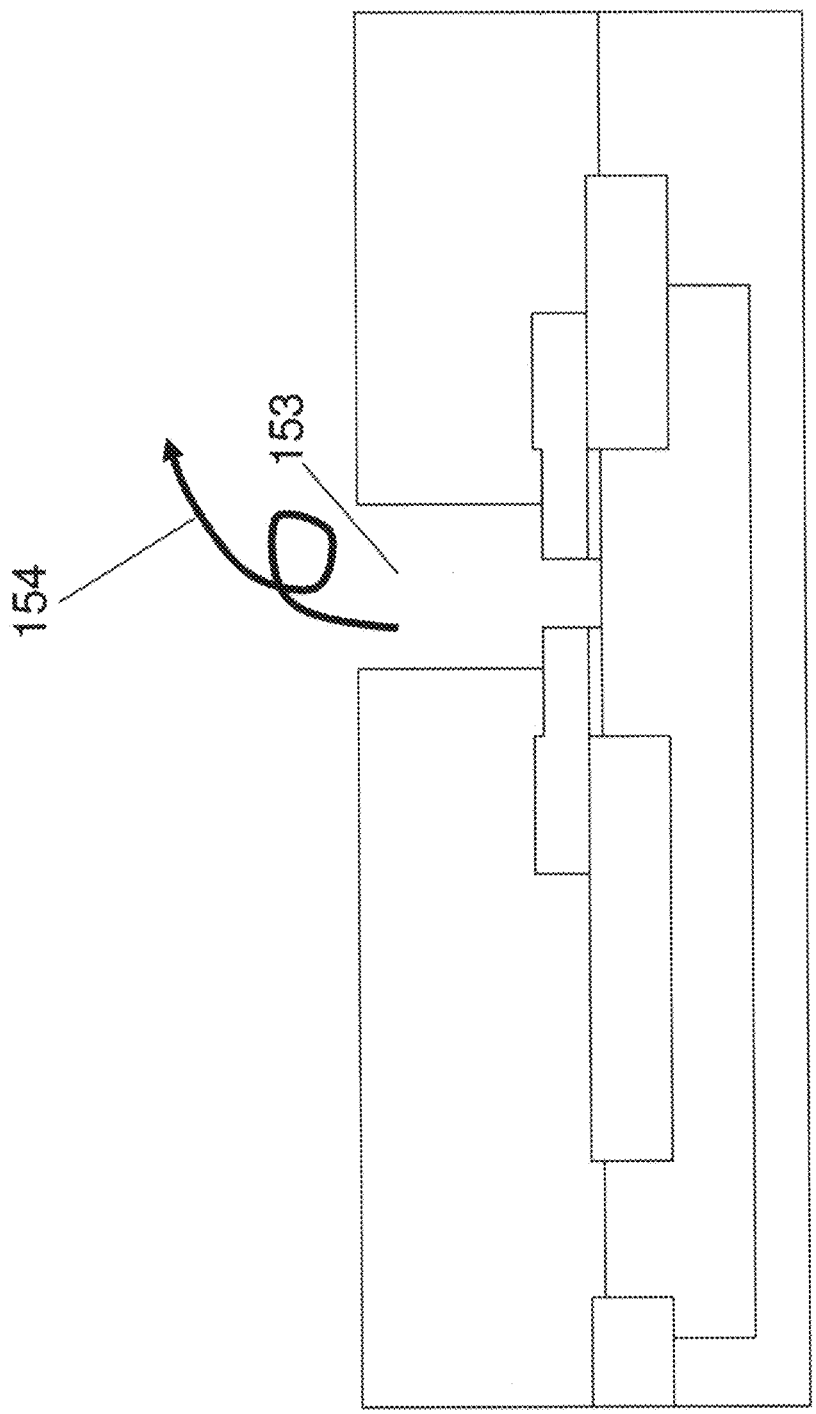
FIG. 5 shows a second stage during processing of a transistor according to an embodiment.

Referring to FIG. 5, the exposed portion 153 (located over the central region of gate 106) is then developed and removed, as indicated by 154.

Figure 6:
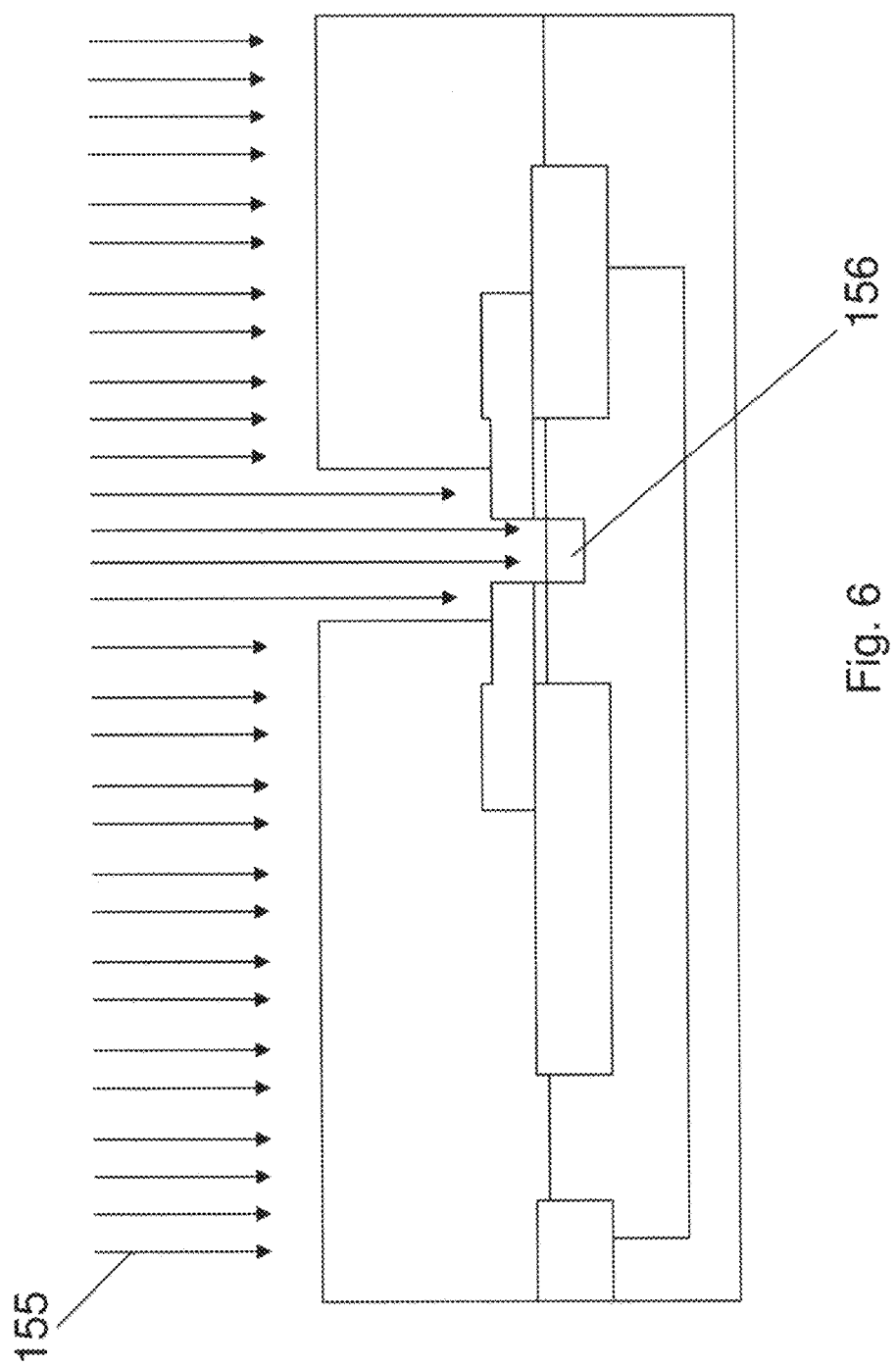
FIG. 6 shows a third stage during processing of a transistor according to an embodiment.

Referring to FIG. 6, an N+ implant 155 is then carried out. This does not affect those portions of the device which are still covered by photo resist. In the area 153 (FIG. 5), the N+ implant 155 reaches the semiconductor surface of P well/base 104, to result in an N+ implanted area 156. This is self-aligned to the opening in poly gate 106 (i.e. poly gate 106 acts as a mask for the implant 155 into P well 104).

Figure 7:
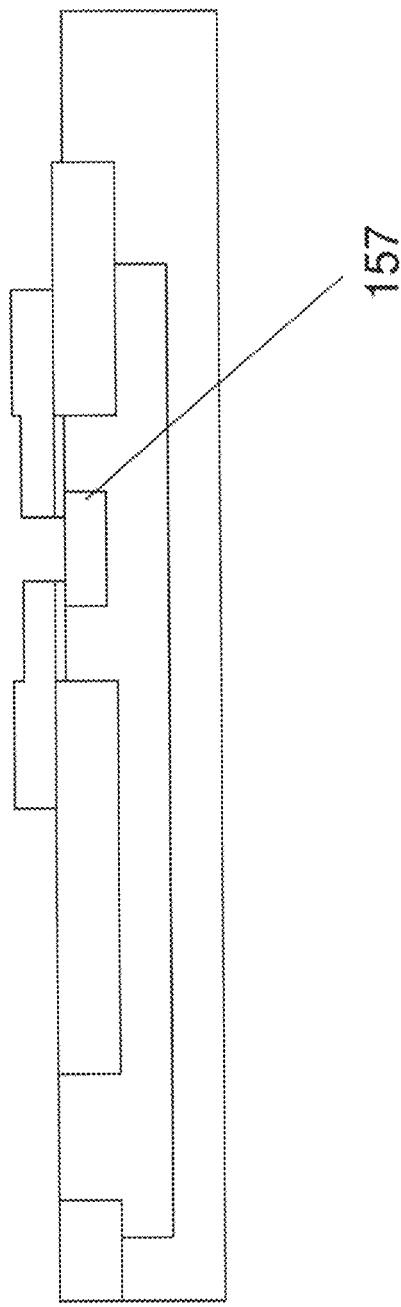
FIG. 7 shows a fourth stage during processing of a transistor according to an embodiment.

Referring to FIG. 7, an annealing step (thermal annealing) is then performed. This causes the implanted region 156 to expand laterally so that areas 157 towards the periphery of implanted region 156 are formed underneath the gate 106. The expanded implanted region 156/157 thus forms the emitter 107. As a result, the poly silicon ring overlaps the base-emitter junction 110.

Figure 3:
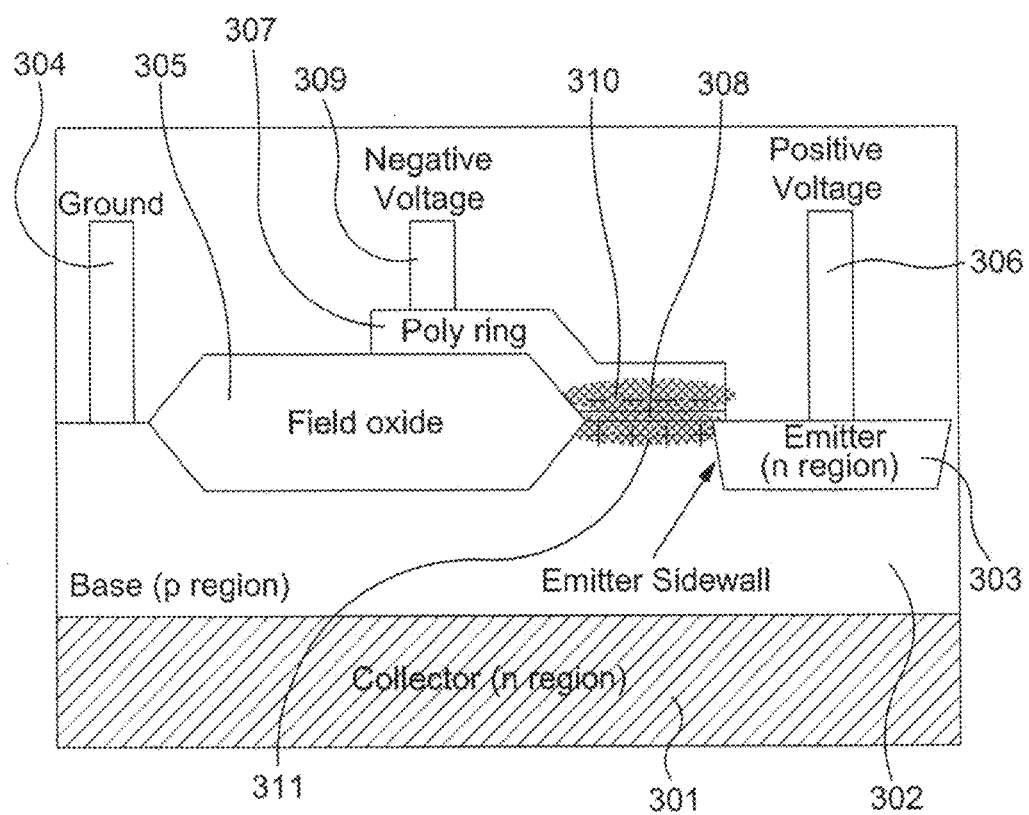
FIG. 3 shows a sectional view of a bipolar junction transistor.

The operation of the bipolar junction transistor—during application of a gate bias voltage of opposite polarity—will now be described in relation to FIG. 3. FIG. 3 shows a bipolar junction transistor according to an embodiment of the present invention. The bipolar junction transistor has a collector region which is doped with negative impurities at the bottom of the figure. Above the collector region is the positively doped base region 302. The emitter region 303 is formed within the base region 302. A base contact 304 is made to the base region 302 on the left-hand side of the figure. Adjacent to the base contact 304 on the surface of the base region 302 there is a field oxide which extends into the base region 302. The field oxide 305 separates the base contact 304 from the emitter region 303 on the surface of the base region 302.

An emitter contact 306 is made to the surface of the emitter region 303. A poly silicon ring 307 overlays the field oxide and runs along the surface of the base region between the field oxide and the emitter region. The poly silicon ring is separated from the base region by an oxide layer 308. The ring and the oxide layer overlap with the surface of the emitter. A contact 309 is made to the poly silicon ring 307.

When the PN junction between the base and the emitter is under forward bias, electrons and holes are injected across the space charge region or depletion layer around the PN junction between the base region 302 and the emitter region 303. Holes are injected from the P-region (the base) and electrons are injected from the N-region (the emitter).

When no bias is applied to the poly silicon ring 307, a fraction of these injected holes and electrons will recombine within the space charge region. Since some of the injected holes are lost due to recombination, additional holes are injected into the base region 302 to make up this loss. These additional injected carriers result in a recombination current. Therefore the total forward bias current density is the sum of the recombination current and the diffusion current densities. At low current densities, the recombination current dominates.

In embodiments of the present invention, this recombination current is suppressed. There are two mechanisms through which embodiments of the present invention suppress the recombination current at low current densities.

The first mechanism is that by applying negative voltage 309 to the poly silicon ring 307, a higher concentration of electrons is formed at the bottom surface of the poly silicon ring 307 where it is closest to the base region 302 (e.g. separated from the base region 302 only by oxide layer 308), as represented by area 310 in FIG. 3. In turn, positive charges 311 are attracted to the silicon surface underneath the poly silicon ring 307 and turn it into accumulation mode, which has the effect of inhibiting electrons being injected from the sidewall of the emitter. This reduction in injected carriers means a reduction in the recombination current.

The second mechanism in which embodiments of the present invention reduce the recombination current is as follows. The surface of the silicon is known as a hotspot for generation-recombination centers due to excess trap densities. By applying a negative voltage to the poly silicon ring 307, the injected electrons from the emitter are repelled away from the silicon surface and flow into the bulk of the base region. This reduces the occurrence of surface recombination events and thereby reduces the recombination current.

The preceding paragraphs describe the operation of the bipolar junction transistor during application of a gate bias voltage of opposite polarity. The operation of the bipolar junction transistor during application of a gate bias voltage of corresponding polarity will now be described, with reference to FIGS. 8 to 12. We will use an NPN transistor and a positive bias voltage as an example. The numbering of different portions of the transistor will generally correspond to FIG. 1.

Figure 8:
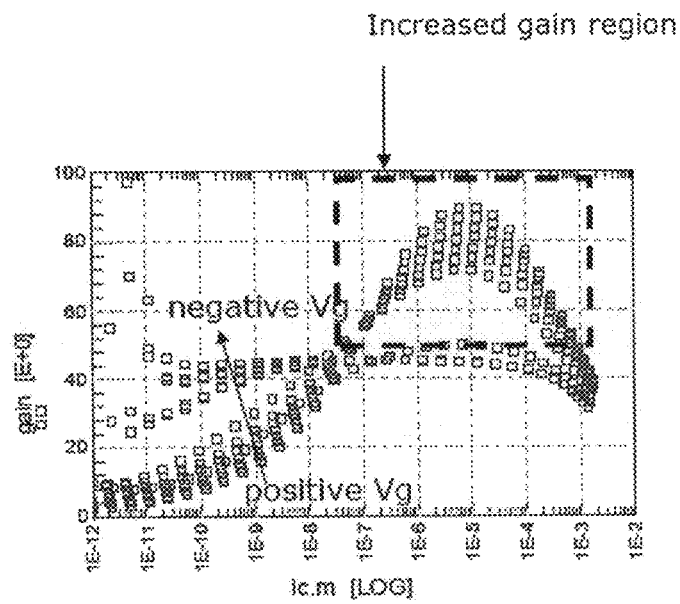
FIG. 8 shows the gain vs. collector current of a transistor according to an embodiment.

FIG. 8 shows a graph of the gain vs. collector current of a transistor according to an embodiment of the present invention. The transistor may, for example, be constructed as the transistors of FIGS. 1 to 3 and manufactured as described above with reference to FIGS. 4 to 7. FIG. 8 plots the gain vs. collector current for different gate voltages $v_g$. As indicated by the arrow in FIG. 8, for negative gate bias voltages the curves are generally flatter (both at lower and higher collector currents) than for positive gate bias voltages.

As indicated by the dashed line rectangle in the right hand part of the figure, the gain can be increased through the application of positive potential to the poly gate 106. For the particular transistor which was used to generate the data for FIG. 8, the collector current range resulting in the gain increase is from about 1e-7A to 1e-3A.

Figure 9:
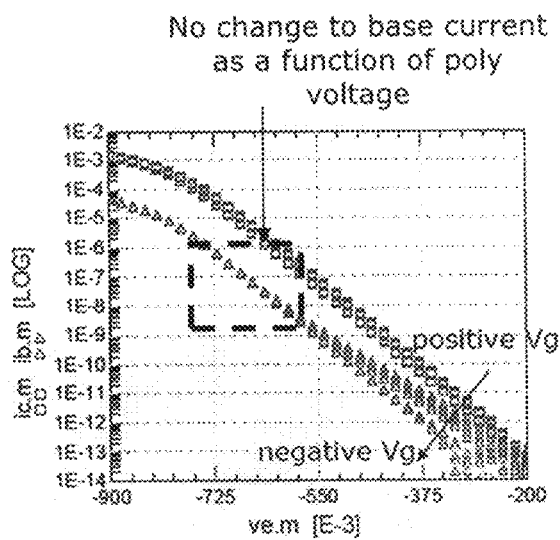
FIG. 9 shows the collector current and base current vs. emitter voltage of a transistor according to an embodiment.

FIG. 9 helps to explain the gain increase shown in FIG. 8. The small triangles represent the base current over an emitter voltage range from −0.9V to −0.2V. Again, different curves are recorded, for different gate voltages, with the arrow indicating curves with positive and negative gate voltages. Within the range indicated by the dashed line rectangle the base current $I_b$ does not vary (significantly) as a function of the gate voltage $v_g$. However, in this range the collector current $I_c$ (small squares in FIG. 9) increases for increased positive gate voltages $v_g$. Note the logarithmic scale in FIG. 9, so a relatively small difference in the position of the $I_c$ curves (squares) in FIG. 9 corresponds to a significant difference in collector current. In other words, the positive gate voltage enables more electrons to be passed from the emitter to the collector while the base current $I_b$ is kept (approximately) constant. With gain=$I_c/I_b$ the gain is increased.

Figure 10:
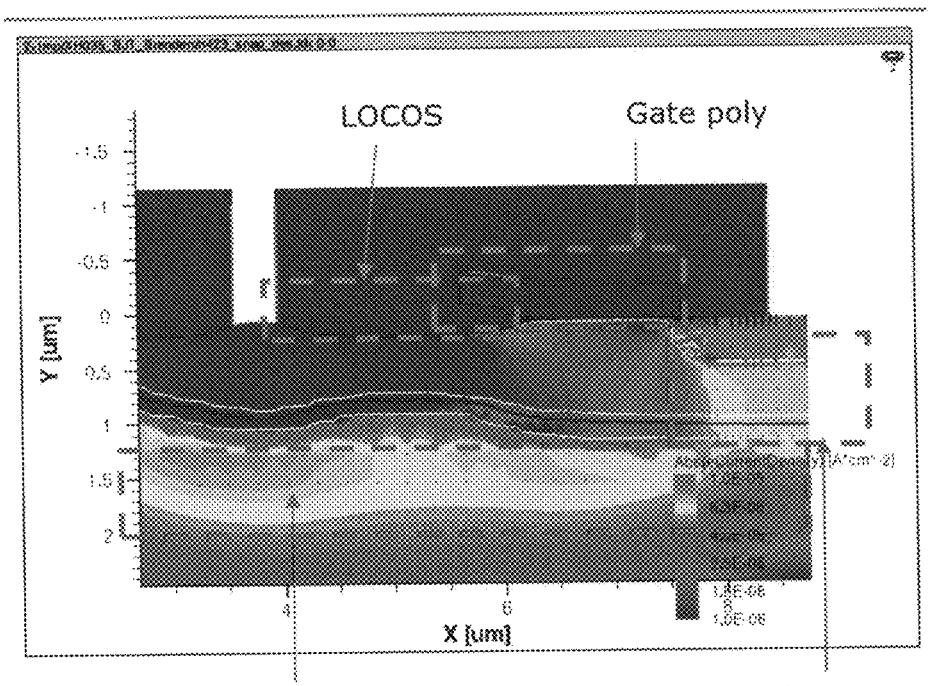
FIG. 10 shows a TCAD simulation illustrating the current flow in various regions of a transistor according to an embodiment, at a first gate bias voltage.
Figure 11:
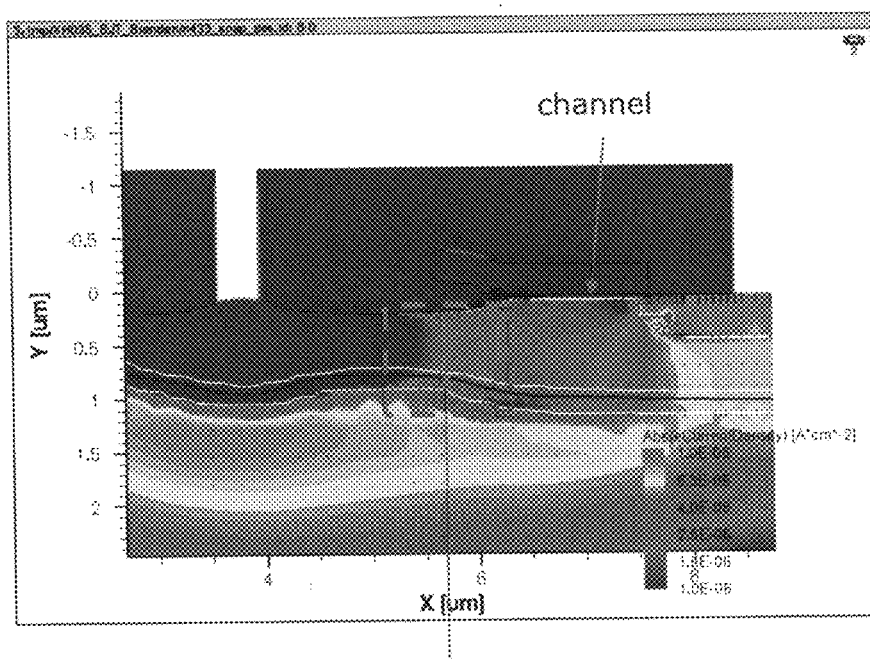
FIG. 11 shows a TCAD simulation illustrating the current flow in various regions of a transistor according to an embodiment, at a second gate bias voltage.

FIGS. 10 and 11 show TCAD simulations to help to explain the gain increase shown in FIG. 8. Both figures use color to illustrate the current density distribution over a cross section of a transistor similar to the one shown in FIG. 3. The current density in FIGS. 10 and 11 ranges from 1E-5 A/cm² (red) via orange, yellow, green and turquoise to 1E-6 A/cm² (blue).

FIG. 10 shows the "normal" situation with 0V on the poly gate 106. The electrons injected from the emitter 107 are swept across the base region and collected by the collector 102. This vertical current path is represented by the orange region of high electron density under the emitter 107.

FIG. 11 shows the situation with a positive bias (in this example +2V) on the poly gate 106. The vertical current path under the emitter 107 is again present, and this constitutes a primary or main current path. However, by contrast to the "normal" situation of FIG. 10, the positive bias on the poly gate 106 has created a narrow channel of electrons under the gate 106/105 resulting in a secondary current path from the emitter to the collector. This extends from the emitter approximately horizontally as far as the LOCOS bottom right corner where the electrons again travel vertically down to the collector.

The creation of the secondary current path can be explained as follows. The positive bias on the gate 106 creates a channel of electrons under the poly gate 106. This acts as a reservoir of electrons. This reservoir of electrons may extend up to, or close to, the interface 113 between the field oxide (FOX) 103 and the base material 104. The gate poly 106 overlaps with interface 113. As the poly 106 extends up along the FOX bird's beak 112 the electric field strength seen in the base material (under the bird's beak 112) reduces to such an extent that there no longer is inversion in this region, or that this region is only weakly inverted. As a result, this region can access the electrons from the channel but is also available for an additional current mechanism—diffusion—to the collector. This is what provides the additional, secondary path from the channel to the collector, thus increasing the collector current and therefore the bipolar gain.

In other words, more electrons have been made available for conduction but at no expense for the base current. The base current remains constant so since gain=Ic/Ib the gain is increased.

Conventionally, in order to increase the collector or emitter current one has to increase the emitter area. In doing this the increased emitter/collector current is accompanied by an increase in base-emitter diffusion current and therefore, if both base and collector currents are increasing, the change in gain is negated.

According to embodiments of the present invention it is possible to increase the available area of emitter injected carriers without the consequence of increased base diffusion current.

Whilst the secondary current mechanism has been described above with reference to a particular transistor geometry with a FOX having a bird's beak, it is envisaged that other geometries are possible if they result in a secondary current path or result in the electric field strength in the base material to be (gradually) reduced.

Figure 12:
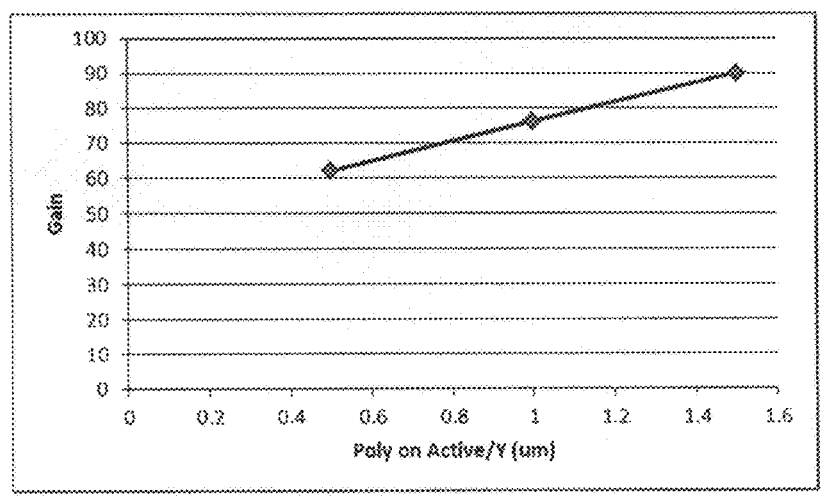
FIG. 12 shows the gain vs. a particular gate dimension at a given gate bias voltage according to an embodiment.

The inventors have found a relation between a particular dimension "Y" of a transistor according to an embodiment of the invention and the gain which can be achieved under suitable operating conditions (dashed line rectangle of FIG. 8), and this relation is shown in FIG. 12. This dimension "Y" is the width of that portion of the poly gate 106 which is located on the base material 104—separated from this only by the thin gate oxide 105 but not by the thicker FOX. Alternatively, one could regard it as the distance between the FOX and the emitter. In FIG. 12 this is referred to as "poly on active". The inventors have found that the greater the value of "Y", the greater the emitter/collector current or the gain of the transistor. In the example shown in FIG. 12 dimension Y is varied between 0.5 µm and 1.5 µm (the emitter width in this example was 2 µm). The larger the dimension Y the larger the area over which electrons are held for conduction to the collector via the FOX bird's beak, as described with reference to FIG. 11.

In a particular embodiment the gate oxide was about 7 nm thick and the field oxide was significantly thicker—about 330 nm thick. However, it will be appreciated that other dimensions may be suitable.

It is envisaged that devices according to the present invention can be made according to a conventional CMOS process without extra processing steps. The difference is in the layout. The poly silicon ring can be formed at the same time as the CMOS gate poly. The poly silicon ring is not etched away during the CMOS gate poly step.

Alternatively, metal can be used for the conductive ring element. If metal is to be used, then the metal ring can be formed during the metal step in which the metal contacts for the base, emitter and collector are formed.

While the above embodiments have been described in a NPN transistor, the conductive element could also be applied to a PNP transistor, with appropriate reversal of the polarities mentioned in this specification.

While the above embodiments have been described with reference to a poly silicon or metal ring, it is not absolutely essential that the material is provided as a ring. Firstly, the precise geometry of the material is immaterial in most applications. Secondly, the material does not need to be present around the whole length of the junction but could be interrupted at one or more places.

The conductive element straddles the periphery of the base emitter junction, so the shape of the conductive element depends on the shape of the emitter. The conductive element inhibits charge carriers in the region underneath it and therefore it reduces recombination in these areas.

Therefore it is advantageous if the conductive element can be placed over areas known to be recombination hot spots such as the edge of the LOCOS and the surface of the silicon in the transistor.

The poly silicon ring or, more broadly, the at least partially conductive element can be placed on the silicon surface as described with reference to the figures above. However this is not essential. A conductive element could also be included in a device which is covered in a dielectric layer, such as an interlayer dielectric (ILD) through which metal plugs are formed so as to connect the emitter, base, collector and conductive element (ring). In this case, the conductive element would not necessarily be placed on the surface of the device but would be integrated into the device.

Further, the ring does not need to be conductive or partially conductive. Embodiments are possible in which the ring is capable of carrying an electric charge without being conductive or partially conductive.

It is further to be understood that the invention is not limited to a transistor with LOCOS/STI barriers. The invention also finds application in other devices without such barriers, for example junction transistors.

Although the invention has been described in terms of preferred embodiments as set forth above, it should be understood that these embodiments are for illustration only and that the claims are not limited to these embodiments. Those of skill in the art will be able to make modifications and alternatives in view of the disclosure which are contemplated as falling within the scope of the appended claims. Each feature disclosed or illustrated in the present specification may be incorporated in the invention whether alone or in any appropriate combination with any other feature disclosed or illustrated herein.

The invention claimed is:

1. A bipolar junction transistor comprising:
an emitter region;
an oxide region;
a base region located between the emitter region and the oxide region and having a junction with the emitter region and an interface with the oxide region;
a collector region; and
an at least partially conductive element positioned to overlap with at least part of the junction between the base region and the emitter region,
wherein said element also overlaps with at least part of the interface between the base region and the oxide region,
wherein said transistor comprises a conducive contact on the base region and a conductive contact on the at least partially conductive element, the at least partially conductive element comprising at least a first region and a second region;
wherein said oxide region comprises a field oxide region, and the transistor further comprises a gate oxide region being closer to the emitter than the field oxide, the gate oxide region having a thickness which is less than the thickness of the field oxide region,
wherein the first region of said element being separated from the base region by the gate oxide region, and the second region of said element being separated from the base region by the filed oxide region, the field oxide region having a transitional region with a thinner end adjacent the gate oxide region and the transitional region increasing gradually in thickness at increasing distances from the emitter; and
wherein the base region extends from the emitter on a first side of the oxide region and the gate oxide region such that it overlaps at least part of the field oxide region and the element extends on a second side of the oxide region and the gate oxide region, such that it overlaps at least part of the field oxide region.

2. The bipolar junction transistor according to claim 1, wherein:
the first region of said element is closer to the emitter region than the second region of said element; and
the base region, the oxide region and the at least partially conductive element are formed such that, when a bias voltage is applied to the at least partially conductive element, the electrical field strength in the base region due to the bias in the first region of said element is greater than the electrical field strength in the base region due to the bias in the second region of said element.

3. The bipolar junction transistor according to claim 1, wherein:
the first region of said element is closer to the emitter region than the second region of said element; and
the base region, the oxide region and the at least partially conductive element are formed such that, when a bias voltage is applied to the at least partially conductive element, the electrical field strength in the base region under the first region of said element is greater than the electrical field strength in the base region under the second region of said element.

4. The bipolar junction transistor according to claim 1, wherein when a bias voltage is applied to the at least partially conductive element, the electrical field strength in the base region diminishes gradually at increasing distances from the emitter.

5. The bipolar junction transistor according to claim 1, wherein:
the first region of said element is closer to the emitter region than the second region of said element; and
the base region, the oxide region and the at least partially conductive element are formed such that, in the second region of said element, the distance between said element and the base region is greater than in the first region of said element.

6. The bipolar junction transistor according to claim 5, wherein the distance between said element and the base region increases gradually at increasing distances from the emitter.

7. The bipolar junction transistor according to claim 1, wherein the transitional region of the oxide region is tapered.

8. The bipolar junction transistor according to claim 7, wherein the transitional region is adjacent to said interface.

9. The bipolar junction transistor according to claim 1, wherein: the base region, the oxide region and the at least partially conductive element are formed such that, when a bias voltage is applied to the at least partially conductive element, the bias voltage having a polarity which corresponds to the doping polarity of the base region, a secondary current path between emitter and collector is created.

10. The bipolar junction transistor according to claim 1, wherein: the base region, the oxide region and the at least partially conductive element are formed such that, when a bias voltage is applied to the at least partially conductive element, the bias voltage having a polarity which corresponds to the doping polarity of the base region, a gain of the transistor is increased.

11. The bipolar junction transistor according to claim 1, wherein the at least partially conductive element comprises polycrystalline silicon.

12. The bipolar junction transistor according to claim 1, wherein the at least partially conductive element comprises metal.

13. The bipolar junction transistor according to claim 1, wherein the at least partially conductive element forms a ring.

14. The bipolar junction transistor according to claim 1, wherein the at least partially conductive element is electrically isolated from the emitter region, the base region and the collector region.

15. A method comprising:
providing a bipolar junction transistor comprising:
an emitter region;
an oxide region;
a base region located between the emitter region and the oxide region and having a junction with the emitter region and an interface with the oxide region;
a collector region; and
an at least partially conductive element positioned to overlap with at least part of the junction between the base region and the emitter region,
wherein said element also overlaps with at least part of the interface between the base region and the oxide region;
wherein said transistor comprises a conductive contact to the base region and a conductive contact to the at least partially conductive element;
wherein said oxide region comprises a field oxide region, and the transistor further comprises a gate oxide region;
the gate oxide region being closer to the emitter than the field oxide region and the gate oxide region having a thickness which is less than the thickness of the field oxide region;
the at least partially conductive element comprises at least a first region and a second region;
the first region of said element being separated from the base region by the gate oxide region;
the second region of said element being separated from the base region by the field oxide region;
the field oxide region having a transitional region with a thinner end adjacent the gate oxide region and the transitional region increasing gradually in thickness at increasing distances from the emitter; and
wherein the base region extends from the emitter on a first side of the oxide region and the gate oxide region such that it overlaps at least part of the field oxide region and the element extends on a second side of the oxide region and the gate oxide region, such that it overlaps at least part of the field oxide region;
the method further comprising:
applying a bias voltage to the at least partially conductive element, the polarity of the bias voltage corresponding to the doping polarity of the base region; and
increasing the gain of the transistor by increasing the magnitude of the bias.

16. The bipolar junction transistor according to claim 1, wherein the conductive contact on the base region is arranged to receive a base current for changing the state of the transistor between non-conductive and conductive.

17. The bipolar junction transistor according to claim 1, wherein a doping of the emitter region and a doping of the collector region have the same polarity and are of opposite polarity to a doping of the base region.

18. The bipolar junction transistor according to claim 1, wherein the conductive contact on the base region comprises metal.

19. The method of claim 15, further comprising arranging the conductive contact on the base region to receive a base current for changing the state of the transistor between non-conductive and conductive.

20. The method as claimed in claim 15, wherein a doping of the emitter region and a doping of the collector region have the same polarity and are of opposite polarity to a doping of the base region.

21. The method of claim 15, wherein the conductive contact on the base region comprises metal.

22. The bipolar junction transistor according to claim 1, wherein, when a base current is applied to the conductive contact on the base region, the state of the transistor will change between non-conductive and conductive.

* * * * *